United States Patent [19]
Goyal et al.

[11] Patent Number: 5,741,377
[45] Date of Patent: Apr. 21, 1998

[54] STRUCTURES HAVING ENHANCED BIAXIAL TEXTURE AND METHOD OF FABRICATING SAME

[75] Inventors: Amit Goyal, Knoxville; John D. Budai, Oak Ridge; Donald M. Kroeger, Knoxville; David P. Norton, Knoxville; Eliot D. Specht, Knoxville; David K. Christen, Oak Ridge, all of Tenn.

[73] Assignee: Martin Marietta Energy Systems, Inc., Oak Ridge, Tenn.

[21] Appl. No.: 419,583

[22] Filed: Apr. 10, 1995

[51] Int. Cl.$^6$ ........................................... C22F 1/00
[52] U.S. Cl. ..................... 148/512; 148/525; 148/537; 505/470; 505/500
[58] Field of Search .................. 148/512, 525, 148/537; 505/430, 434, 470, 474, 500

[56] References Cited

U.S. PATENT DOCUMENTS

| | | | |
|---|---|---|---|
| 3,770,497 | 11/1973 | Hassler et al. | 148/512 |
| 5,104,456 | 4/1992 | Dvornak et al. | 148/552 |
| 5,212,148 | 5/1993 | Roas et al. | 505/1 |
| 5,248,662 | 9/1993 | Yoshida et al. | 505/1 |
| 5,290,761 | 3/1994 | Keating et al. | 505/1 |
| 5,312,804 | 5/1994 | Petitbon et al. | 505/434 |
| 5,372,089 | 12/1994 | Yoshida et al. | 505/434 |
| 5,432,151 | 7/1995 | Russo et al. | 505/474 |

FOREIGN PATENT DOCUMENTS

| | | | |
|---|---|---|---|
| 697916 | 11/1964 | Canada | 148/512 |
| 1-100818 | 4/1989 | Japan. | |
| 1-100820 | 4/1989 | Japan. | |
| 6-139848 | 5/1994 | Japan. | |

OTHER PUBLICATIONS

A. Ginsbach et al, Growth of C-Axis Oriented YBaCuO Films on Oxidized Textured Ni Sheets and on (100) and (110) Oriented NiO Single Crystals, *IIE Transactions on Magnetics*, vol. 27, (1991) 1410.

Primary Examiner—George Wyszomierski
Attorney, Agent, or Firm—Joseph A. Marasco

[57] ABSTRACT

A biaxially textured article includes a rolled and annealed, biaxially textured substrate of a metal having a face-centered cubic, body-centered cubic, or hexagonal close-packed crystalline structure; and an epitaxial superconductor or other device epitaxially deposited thereon.

16 Claims, 11 Drawing Sheets

STRUCTURES HAVING ENHANCED BIAXIAL TEXTURE AND METHOD OF FABRICATING SAME

The United States Government has rights in this invention pursuant to contract no. DE-AC05-84OR21400 between the United States Department of Energy (DOE) and Martin Marietta Energy Systems, Inc. The invention was funded by the Superconductivity Program for Electric Power Systems, DOE Office of Energy Efficiency and Renewable Energy, and the DOE Division of Materials Science.

FIELD OF THE INVENTION

The present invention relates to biaxially textured metallic substrates and articles made therefrom, and more particularly to such substrates and articles made by rolling a metallic substrate to obtain a biaxial texture, followed by deposition of epitaxial materials thereon, with an emphasis on superconductors.

BACKGROUND OF THE INVENTION

Current materials research aimed at fabricating high-temperature superconducting ceramics in conductor configurations for bulk, practical applications, is largely focused on powder-in-tube methods. Such methods have proved quite successful for the Bi—(Pb)—Sr—Ca—Cu—O (BSCCO) family of superconductors due to their unique mica-like mechanical deformation characteristics. In high magnetic fields, this family of superconductors is generally limited to applications below 30K. In the Re—Ba—Cu—O (ReBCO, Re denotes a rare earth element), Tl—(Pb,Bi)—Sr—(Ba)—Ca—Cu—O and Hg—(Pb)—Sr—(Ba)—Ca—Cu—O families of superconductors, some of the compounds have much higher intrinsic limits and can be used at higher temperatures. FIG. 1 shows a comparison of optimized properties of various superconductors.

It has been demonstrated that these superconductors possess high critical current densities (Jc) at high temperatures when fabricated as single crystals or in essentially single-crystal form as epitaxial films on single crystal substrates such as $SrTiO_3$ and $LaAlO_3$. These superconductors have so far proven intractable to conventional ceramics and materials processing techniques to form long lengths of conductor with $J_c$ comparable to epitaxial films. This is primarily because of the "weak-link" effect.

It has been demonstrated that in ReBCO, biaxial texture is necessary to obtain high transport critical current densities. High $J_c$'s have been reported in polycrystalline ReBCO in thin films deposited on special substrates on which a biaxially textured non-superconducting oxide buffer layer is first deposited using ion-beam assisted deposition (IBAD) techniques. IBAD is a slow, expensive process, and difficult to scale up for production of lengths adequate for many applications.

High $J_c$'s have also been reported in polycrystalline ReBCO melt-processed bulk material which contains primarily small angle grain boundaries. Melt processing is also considered too slow for production of practical lengths.

Thin-film materials having perovskite-like structures are important in superconductivity, ferroelectrics, and electro-optics. Many applications using these materials require, or would be significantly improved by, single crystal, c-axis oriented perovskite-like films grown on single-crystal or highly aligned metal or metal-coated substrates.

For instance, Y—$Ba_2$—$Cu_3$—$O_x$ (YBCO) is an important superconducting material for the development of superconducting current leads, transmission lines, motor and magnetic windings, and other electrical conductor applications. When cooled below their transition temperature, superconducting materials have no electrical resistance and carry electrical current without heating up. One technique for fabricating a superconducting wire or tape is to deposit a YBCO film on a metallic substrate. Superconducting YBCO has been deposited on polycrystalline metals in which the YBCO is c-axis oriented, but not aligned in-plane. To carry high electrical currents and remain superconducting, however, the YBCO films must be biaxially textured, preferably c-axis oriented, with effectively no large-angle grain boundaries, since such grain boundaries are detrimental to the current-carrying capability of the material. YBCO films deposited on polycrystalline metal substrates do not generally meet this criterion.

The terms "process", "method", and "technique" are used interchangeably herein.

For further information, refer to the following publications:

1. K. Sato, et al., "High-$J_c$ Silver-Sheathed Bi-Based Superconducting Wires", *IEEE Transactions on Magnetics*, 27 (1991) 1231.
2. K. Heine, et al., "High-Field Critical Current Densities in $Bi_2Sr_2Ca_1Cu_2O_{8+x}$/Ag Wires", *Applied Physics Letters*, 55 (1991) 2441.
3. R. Flukiger, et al., "High Critical Current Densities in Bi(2223)/Ag tapes", *Superconductor Science & Technology* 5, (1992) S61.
4. D. Dimos et al., "Orientation Dependence of Grain-Boundary Critical Currents in $Y_1Ba_2Cu_3O_{7-\delta}$ Bicrystals", *Physical Review Letters*, 61 (1988) 219.
5. D. Dimos et al., "Superconducting Transport Properties of Grain Boundaries in $Y_1Ba_2Cu_3O_7$ Bicrystals", *Physical Review B*, 41 (1990) 4038.
6. Y. Iijima, et al., "Structural and Transport Properties of Biaxially Aligned $YBa_2Cu_3O_{7-x}$ Films on Polycrystalline Ni-Based Alloy with Ion-Beam Modified Buffer Layers", *Journal of Applied Physics*, 74 (1993) 1905.
7. R. P. Reade, et al. "Laser Deposition of biaxially textured Yttria-Stabilized Zirconia Buffer Layers on Polycrystalline Metallic Alloys for High Critical Current Y—Ba—Cu—O Thin Films", *Applied Physics Letters*, 61 (1992) 2231.
8. D. Dijkkamp et al., "Preparation of Y—Ba—Cu Oxide Superconducting Thin Films Using Pulsed Laser Evaporation from High Tc Bulk Material," *Applied Physics Letters*, 51, 619 (1987).
9. S. Mahajan et al., "Effects of Target and Template Layer on the Properties of Highly Crystalline Superconducting a-Axis Films of $YBa_2Cu_3O_{7-x}$ by DC-Sputtering," *Physics C*, 213, 445 (1993).
10. A. Inam et al., "A-axis Oriented Epitaxial $YBa_2Cu_3O_{7-x}$—$PrBa_2Cu_3O_{7-x}$ Heterostructures," *Applied Physics Letters*, 57, 2484 (1990).
11. R. E. Russo et al., "Metal Buffer Layers and Y—Ba—Cu—O Thin Films on Pt and Stainless Steel Using Pulsed Laser Deposition," *Journal of Applied Physics*, 68, 1354 (1990).
12. E. Narumi et al., "Superconducting $YBa_2Cu_3O_{6.8}$ Films on Metallic Substrates Using In Situ Laser Deposition," *Applied Physics Letters*, 56, 2684 (1990).
13. R. P. Reade et al., "Laser Deposition of Biaxially Textured Yttria-Stabilized Zirconia Buffer Layers on Polycrystalline Metallic Alloys for High Critical Current Y—Ba—Cu—O Thin Films," *Applied Physics Letters*, 61, 2231 (1992).

14. J. D. Budai et al., "In-Plane Epitaxial Alignment of YBa$_2$Cu$_3$O$_{7-x}$ Films Grown on Silver Crystals and Buffer Layers," *Applied Physics Letters*, 62, 1836 (1993).

15. T. J. Doi et al., "A New Type of Superconducting Wire; Biaxially Oriented Tl$_1$(Ba$_{0.8}$Sr$_{0.2}$)$_2$Ca$_2$Cu$_3$O$_9$ on {100}<100> Textured Silver Tape," *Proceedings of 7th International Symposium on Superconductivity*, Fukuoka, Japan, Nov. 8–11, 1994.

16. D. Forbes, Executive Editor, "Hitachi Reports 1-meter Tl-1223 Tape Made by Spray Pyrolysis", *Superconductor Week*, Vol. 9, No. 8, Mar. 6, 1995.

17. *Recrystallization, Grain Growth and Textures*, Papers presented at a Seminar of the American Society for Metals, Oct. 16 and 17, 1965, American Society for Metals, Metals Park, Ohio.

OBJECTS OF THE INVENTION

Accordingly, it is an object of the present invention to provide a new and improved method for fabricating alloy and laminated structures having biaxial texture.

It is another object of the present invention to provide a method to produce epitaxial superconductors on alloy and laminated structures having biaxial texture by practically scalable processes.

It is a further object of the present invention to provide c-axis oriented, biaxially textured, superconducting YBCO films, or other perovskite-like materials, such as SrTiO$_3$, reproducibly obtainable on single-crystal Ag, biaxially textured Ag, or other metals on which an epitaxial Ag buffer layer can be formed.

It is a further object of the present invention to provide c-axis oriented, biaxially textured perovskite-like ferroelectric films on Ag for metal/ferroelectric/metal multilayer devices.

Further and other objects of the present invention will become apparent from the description contained herein.

SUMMARY OF THE INVENTION

In accordance with one aspect of the present invention, the foregoing and other objects are achieved by a method of preparing a biaxially textured alloy article including the steps of:

a. rolling a base metal preform to form a biaxially textured substrate having a surface, the base metal preform having a face-centered cubic, body-centered cubic, or hexagonal close-packed crystalline structure, the biaxially textured substrate being characterized by an x-ray diffraction phi scan peak of no more than 20° full width at half maximum (FWHM);

b. depositing onto the surface of the biaxially textured substrate an alloying agent to form a laminate; and, c. heating the laminate to a sufficient temperature and for a sufficient time to cause interdiffusion of the base metal and the alloying agent, while maintaining the biaxial texture of the biaxially textured substrate, while transferring the biaxial texture to the alloying agent and while preventing homogeneous melting, to form a biaxially textured alloy article.

In accordance with another aspect of the present invention, a method of preparing a biaxially textured laminate article including the steps of:

a. rolling and annealing a metal base preform to form a biaxially textured substrate having a surface, the base metal preform having a face-centered cubic, body-centered cubic, or hexagonal close-packed crystalline structure, the biaxially textured substrate being characterized by an x-ray diffraction phi scan peak of no more than 20° FWHM; and, b. depositing onto the surface of the biaxially textured substrate an epitaxial layer of material to form a biaxially textured laminate.

In accordance with a further aspect of the present invention a method of preparing a biaxially textured laminate article including the steps of:

a. rolling and annealing a base metal preform to form a biaxially textured substrate having a surface, the metal preform having a face-centered cubic, body-centered cubic, or hexagonal close-packed crystalline structure;

b. depositing onto the surface of the biaxially textured substrate a layer of material to form a laminate; and, c. heating the laminate to a sufficient temperature and for a sufficient time to induce epitaxy in the material to form a biaxially textured laminate.

In accordance with another aspect of the present invention, a method of preparing a biaxially textured laminate article including the steps of:

a. providing a substrate having a biaxially textured Ag surface;

b. depositing onto the surface of the substrate an epitaxial buffer template layer of ReBCO using a pulsed laser deposition technique at a temperature in the range of about 600° C. to about 700° C., and at an oxygen pressure in the range of about 50 mTorr to about 300 mTorr; and, c. depositing onto the buffer template layer another epitaxial layer of perovskite-like material using a pulsed laser deposition technique.

In accordance with yet another aspect of the present invention, a biaxially textured alloy article including a rolled and annealed biaxially textured metal substrate having a surface, the metal having a face-centered cubic, body-centered cubic, or hexagonal close-packed crystalline structure; and an epitaxial layer of an alloying agent on a surface thereof, the epitaxial layer being bonded to the substrate by alloying.

In accordance with a still further aspect of the present invention, a biaxially textured laminate article including a rolled and annealed biaxially textured base metal substrate, the base metal having a face-centered cubic, body-centered cubic, or hexagonal close-packed crystalline structure, having an epitaxial layer of another material on a surface thereof.

In accordance with yet a further aspect of the present invention, a superconductor article including a rolled and annealed, biaxially textured metal substrate, having an epitaxial barrier layer thereon, and an epitaxial superconductor layer on the barrier layer.

In accordance with a further aspect of the present invention, a superconductor article including a rolled and annealed biaxially textured Ag substrate having an epitaxial superconductor layer thereon.

For a better understanding of the present invention, together with other and further objects, advantages and capabilities thereof, reference is made to the following disclosure and appended claims in connection with the above-described drawings.

DETAILED DESCRIPTION OF THE INVENTION

A biaxially textured substrate or sheath material is fabricated by industrially scalable rolling techniques. The substrate can then be coated/reacted by a variety of techniques to produce chemically compatible, textured barrier layers and/or alloys. An epitaxial layer of another material is then grown on the textured substrate (or on a barrier layer as the case may be) using any of a variety of techniques. The texture from the substrate (or the barrier layer) is then induced in the epitaxial layer. It is thereby possible to deposit a biaxially aligned superconductor with high critical current density.

Ag is generally chemically compatible with cuprate superconductors. Attempts to produce a sharp biaxially textured Ag strip by rolling and annealing have proven to be difficult. Hence, articles fabricated as described herein are especially important and distinct with respect to superconductivity.

Such articles are also important from the perspective of other physical properties, e.g., mechanical properties. These articles and methods are contemplated to have applications far beyond superconductivity; for example, they can be used in the fabrication of strong, tough materials for mechanical, magnetic, and ferroelectric applications. It is well established that low energy boundaries—low angle and low-sigma coincident site lattice (CSL)—have superior physical properties, including enhanced mechanical toughness. Hence, a strengthened substrate is described herein, since in these biaxially textured substrates, a high proportion of grain boundaries have small misorientation angles. (The expected grain boundary misorientation distribution can be estimated based on the macroscopic texture determination.) Similar advantages are expected for other physical properties, e.g., magnetic, ferroelectric properties.

Figure 1:
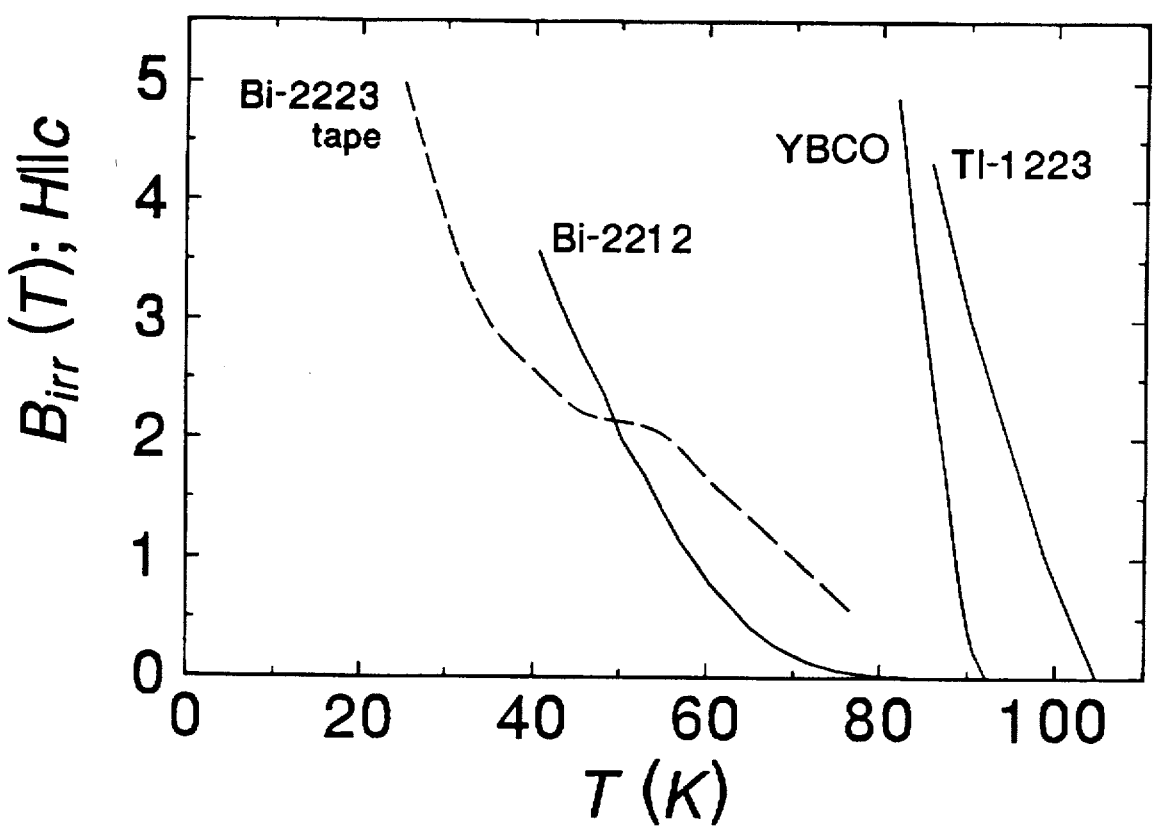
FIG. 1 is a graph showing optimized magnetic irreversibility lines of various high temperature superconductors.
Figure 2:
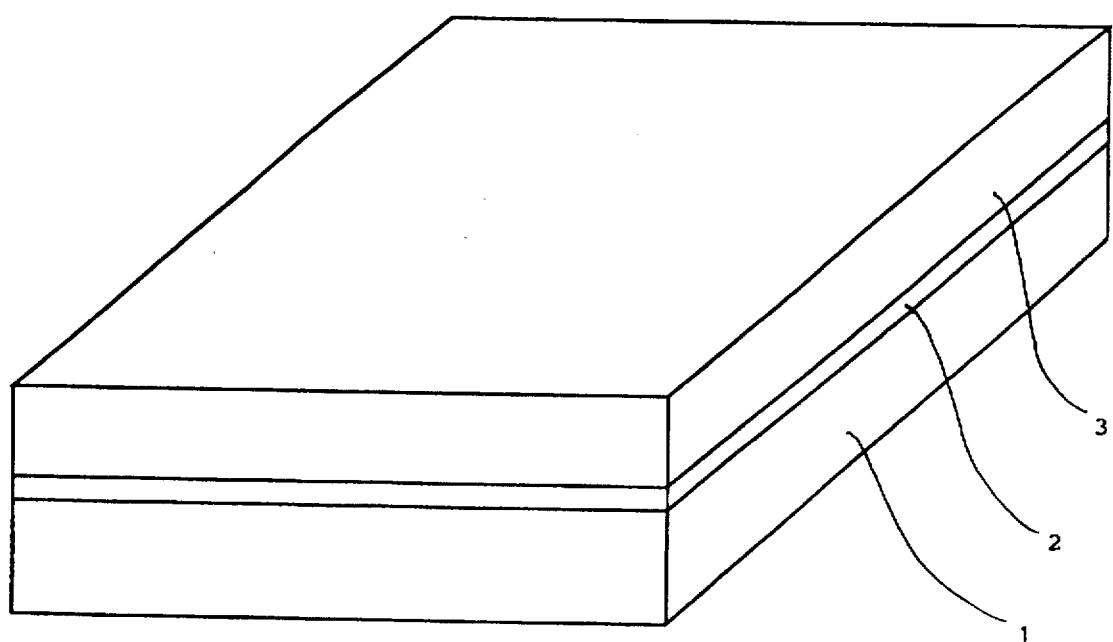
FIG. 2 is an oblique schematic view of a biaxially textured substrate having various epitaxial layers deposited thereon.

Referring to FIG. 2, a biaxially textured substrate 1 has an epitaxial buffer layer 2 deposited thereon, upon which is deposited a second epitaxial layer 3 which is a superconductor, ferroelectric device, or other electromagnetic or electro-optical device. In some cases, the buffer layer 2 is not necessary, and in other cases, multiple buffer layers are preferred or necessary.

Rolling Processes

During the rolling process, plastic flow causes reorientation of the lattice of individual grains of a polycrystalline material and tends to develop a texture or preferred orientation of the lattice in the grains. The progress of reorientation is gradual; the orientation change proceeds as plastic flow continues, until a texture is reached that is stable against indefinite continued flow of a given type. The nature of the stable deformation texture and the manner in which it is approached is characteristic of the material and of the nature of the flow throughout the deformation process (i.e., the magnitude of the three principal strains at all points within the specimen and at successive times during the process). The texture development is strongly influenced by temperature, particularly if the temperature of deformation is high enough for recrystallization to take place. Other effects of temperature include variation of the stacking fault energy and hence the operative deformation mechanisms. In general, plastic strains near the surface of a rolled specimen may differ from those in the interior and may produce textures that vary with depth below the surface. Hence specific rolling procedures are described herein below to ensure reasonably consistent textures through the thickness of the workpiece.

While forward rolling alone may result in homogeneous texture through the thickness of the sheet, we have found that reverse rolling (rolling direction is reversed after each pass) produces much better results in most materials. In most of what is described below, reverse rolling is preferred over forward rolling. The rolling speed and reduction per pass are also important parameters. While rolling speed may be important in the texture development, its effect is not dominating. In general, higher rolling speeds are desirable for economical purposes. Reduction per pass during rolling is also important for texture development. Generally, less than 30% reduction per pass is desirable, although in some cases higher reductions per pass may also be required. The lubrication employed during rolling is also an important variable. Depending on the texture desired, either no lubricant or some lubricant like light mineral oil, heavy mineral oil, kerosene, etc. are employed to ensure homogeneous texture development. Grain size of the starting material and prior heat treatments and deformation history is also important in determining the texture development. In general, prior to rolling, a fine grain size is desired and the initial heat treatments and deformations are designed to give a random texture in the starting material. For general information about rolling and textures derived thereby, see reference 17 above.

Annealing Processes

The development of an annealing texture involves several fundamental mechanisms. An annealing texture may develop from recovery without recrystallization (in which case it would be expected to duplicate the texture present before annealing), from primary recrystallization, or from grain growth subsequent to recrystallization. Grain size distribution can remain normal throughout the process, or a few grains may grow very large while the rest remain approximately unchanged until devoured by the large ones. The latter type of grain growth, referred to as "secondary recrystallization" or "discontinuous", is generally considered to be abnormal.

Getting the Desired Texture

It is known that the critical current density through a grain boundary may be reduced significantly for misorientation angles greater than 5°–20°. It is thus desirable to obtain superconducting deposits in which the number of grain boundaries with misorientation angles greater than 5°–10° is minimized. For conductors in which the superconducting deposit is epitaxial with an underlying metallic or oxide buffer layer or substrate, it is desirable to minimize the number of grain boundaries with misorientations greater than 5°–10°. This is accomplished if the texture of the substrate is so sharp that grain orientations vary by no more than 5°–10°. Useful superconducting layers may be obtained using substrates with larger spread in grain orientation, but the better the substrate texture, the better the properties of the superconductor deposit are expected to be.

In a cube texture, the cube plane lies parallel to the plane of the sheet and a cube edge is parallel to the rolling direction, i.e., (100)[001]. This texture resembles a single crystal with subgrains, but may contain a minor amount of material in twin relation to the principal orientation. A fully developed cube texture, as described herein, has been developed with biaxial alignment with x-ray diffraction peak width of 2° full width at half maximum.

Brass texture is (110)<112>. It does not appear that brass texture is obtainable as sharp as the cube texture.

Formation of Textured Ag Article by Rolling

Strong biaxial texture in Ag is obtainable under closely controlled rolling process conditions. At room temperature, the stacking fault energies in even high purity Ag are such that under most conditions of rolling and annealing, no cube component of the texture forms. As-rolled Ag at room temperature generally develops the (110)<112> texture with two twin-related components. On annealing this texture generally changes to near (113)<211>, which is likely more appropriately designated as (225)<734>. However, upon long annealing times at temperatures greater than 450° C., the primary recrystallization texture of Ag is replaced by secondary grains having the orientations of the deformation texture. Neither the as-rolled texture nor the primary recrystallization texture are sharp. Often, mixed texture components are produced and this results in a significant number of high angle boundaries in the material. On annealing at high temperatures, these high angle boundaries migrate rapidly and the texture changes.

a. Formation of a sharp cube texture in Ag

Since the development of texture is essentially an interplay between deformation twinning and cross-slip, the stacking fault energy is very important. It is well known that the stacking fault energy increases with increase in temperature. One can show that at temperatures above 150° C., the stacking fault energy of Ag is almost same as that of Cu at room temperature. Hence, when rolling Ag at temperatures 150°–500° C. the development of cube texture is generally expected. Above 300° C., it is highly likely that only the cube component remains.

General conditions are listed below for rolling Ag to produce a biaxial cube texture:

Rolling temperature: 50° C.–500° C., preferably 100° C.–400° C., more preferably 180° C.–250° C.

Annealing temperature: 100° C.–960° C., preferably 100° C.–600° C., more preferably 200° C.–400° C.

Preferable purity of Ag is at least 99.99%. As Ag purity decreases, the temperature of deformation increases. If Ag is 99.0% pure, the required deformation temperature may be over 200° C.

EXAMPLE I

A substrate of Ag is rolled under the following conditions to form a sharp cube texture thereon:

Rolling temperature: 220° C.

Rolling speed: 15 ft./min.

Reduction Per Pass: 10%

Rolling direction: Reverse rolling

Lubrication: kerosene

Annealing temperature 300° C.

Purity of Ag—at least 99.99% b. Formation of a sharp brass texture in Ag

Decreasing temperatures results in decrease in the stacking fault energy. This favors the brass component of the texture. In order to obtain a sharp texture one needs to isolate a single texture component. Decreasing the temperature of deformation increases the amount of brass component fraction. Rolling temperature should be no more than 200° C., and annealing temperature should be at least 100° C. The higher the purity of the Ag, the lower the required temperature of deformation.

EXAMPLE II

A strip of Ag was rolled under the following conditions to form a sharp brass texture thereon:

Rolling temperature: 160° C.

Rolling speed: 15 ft./min.

Reduction Per Pass: 10%

Rolling direction: Reverse rolling

Lubrication: light mineral oil

Annealing temperature 300° C.

Purity of Ag—at least 99.99% c) Formation of a (412)<548> texture in Ag

Room temperature rolling of silver imparts a (412)<548> biaxial texture in the rolled sheet. Annealing temperature should be 100° C.–900° C.; preferably 100° C.–400° C.; more preferably 200° C.–300° C.

EXAMPLE III

A strip of Ag was rolled under the following conditions to form a (412)<548> texture thereon:

Rolling temperature: room temperature

Rolling speed: 15 ft./min.

Reduction Per Pass: 10%

Rolling direction: Reverse rolling

Lubrication: none

Annealing temperature 300° C.

Purity of Ag—at least 99.99%

Figure 3:
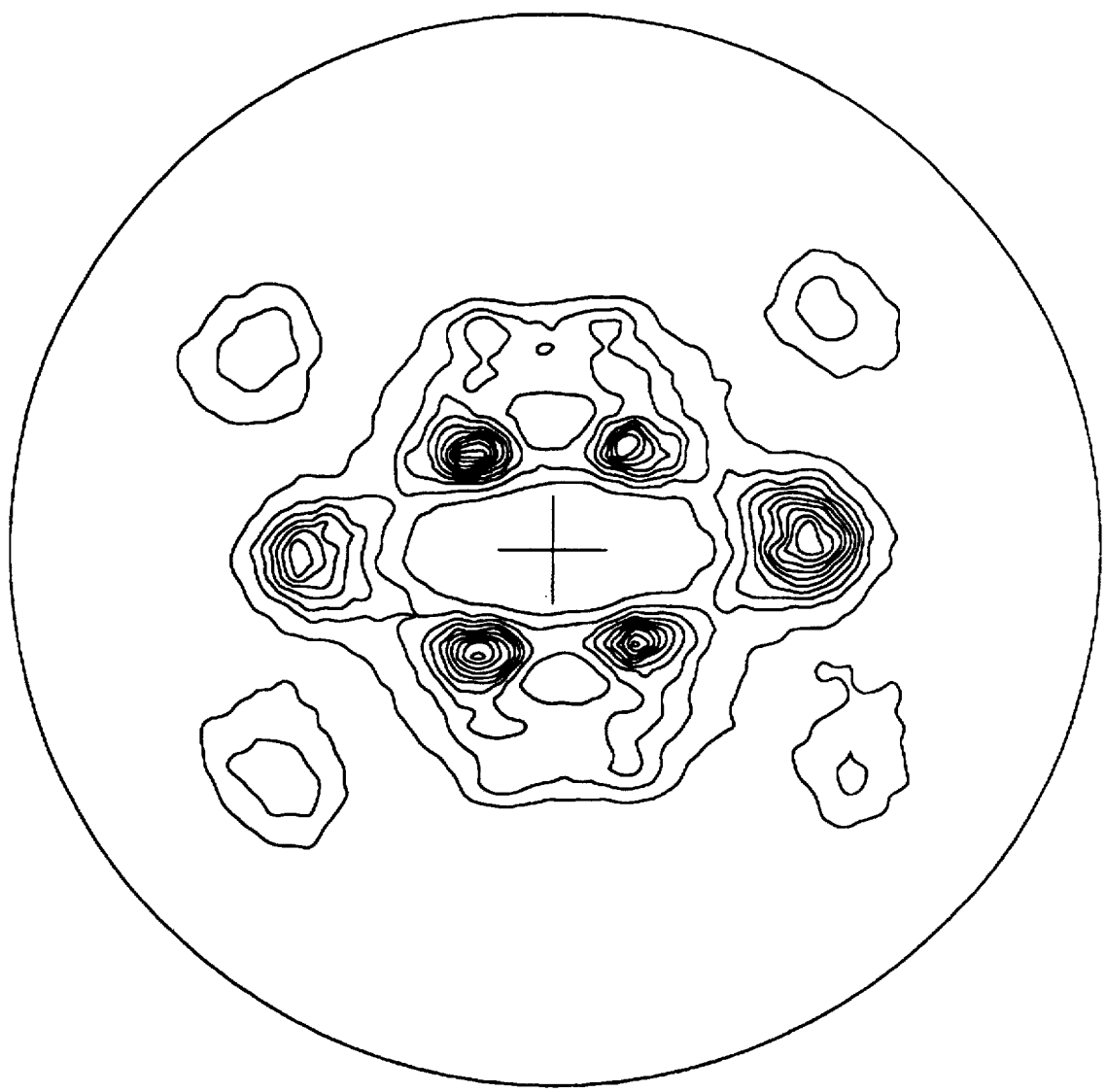
FIG. 3 is a Ag (111) X-ray pole figure of a rolled and annealed tape.
Figure 4:
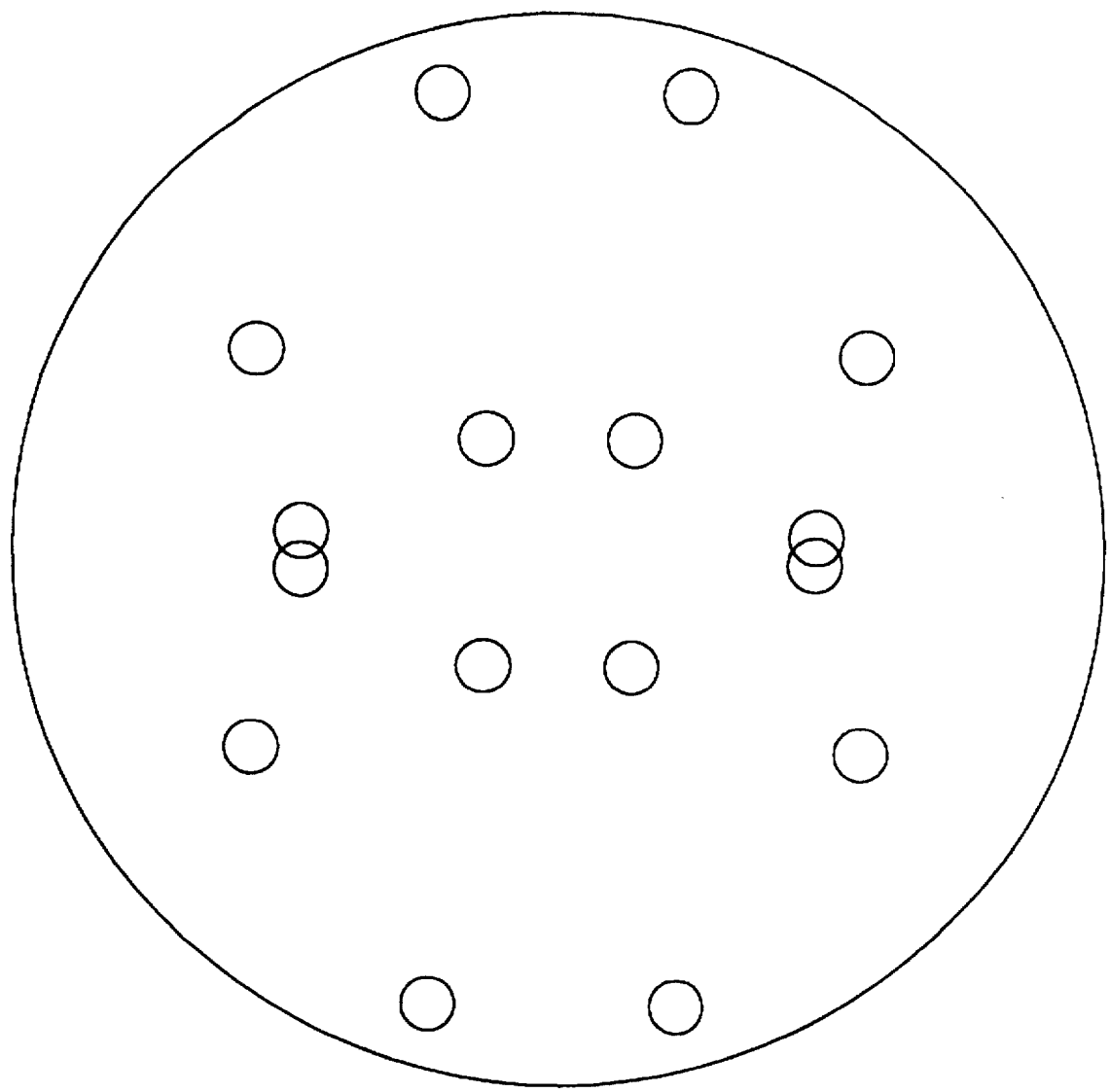
FIG. 4 shows expected intensities for a (412)<548> texture on a Ag (111) pole figure.

FIG. 3 shows Ag (111) X-ray pole figure of a rolled and annealed tape. FIG. 4 shows expected intensities for a (412)<548> texture on a Ag (111) pole figure.

Formation of a Cube Texture in Cubic Metals

A well developed cube texture in metals such as Cu, Ni and Fe can be achieved by heavy rolling process reductions (at least 80%) prior to final annealing. In Al, small reductions prior to final annealing are required to produce the cube texture. In Ag, and in Ag—, Cu—, Ni—, Al— and Fe-based alloys, components of cube texture can be achieved by rolling at higher temperatures (in excess of 100° C.). General conditions for this process are dependent upon the stack fault energy of the metal. The higher the purity of the metal, the lower the required temperature of deformation. Total deformation prior to annealing should be at least 70%, preferably at least 80%. Annealing temperature should be at least 100° C.

EXAMPLE IV

Starting with high purity Cu rods, the above described rolling process was used to produce a sharp cube texture.

Rolling temperature: room temperature

Rolling speed: 15 ft./min.

Reduction Per Pass: 10%

Rolling direction: Reverse rolling

Lubrication: light mineral oil

Annealing temperature 300° C.

Purity of Ag—at least 99.99%

Figure 5:
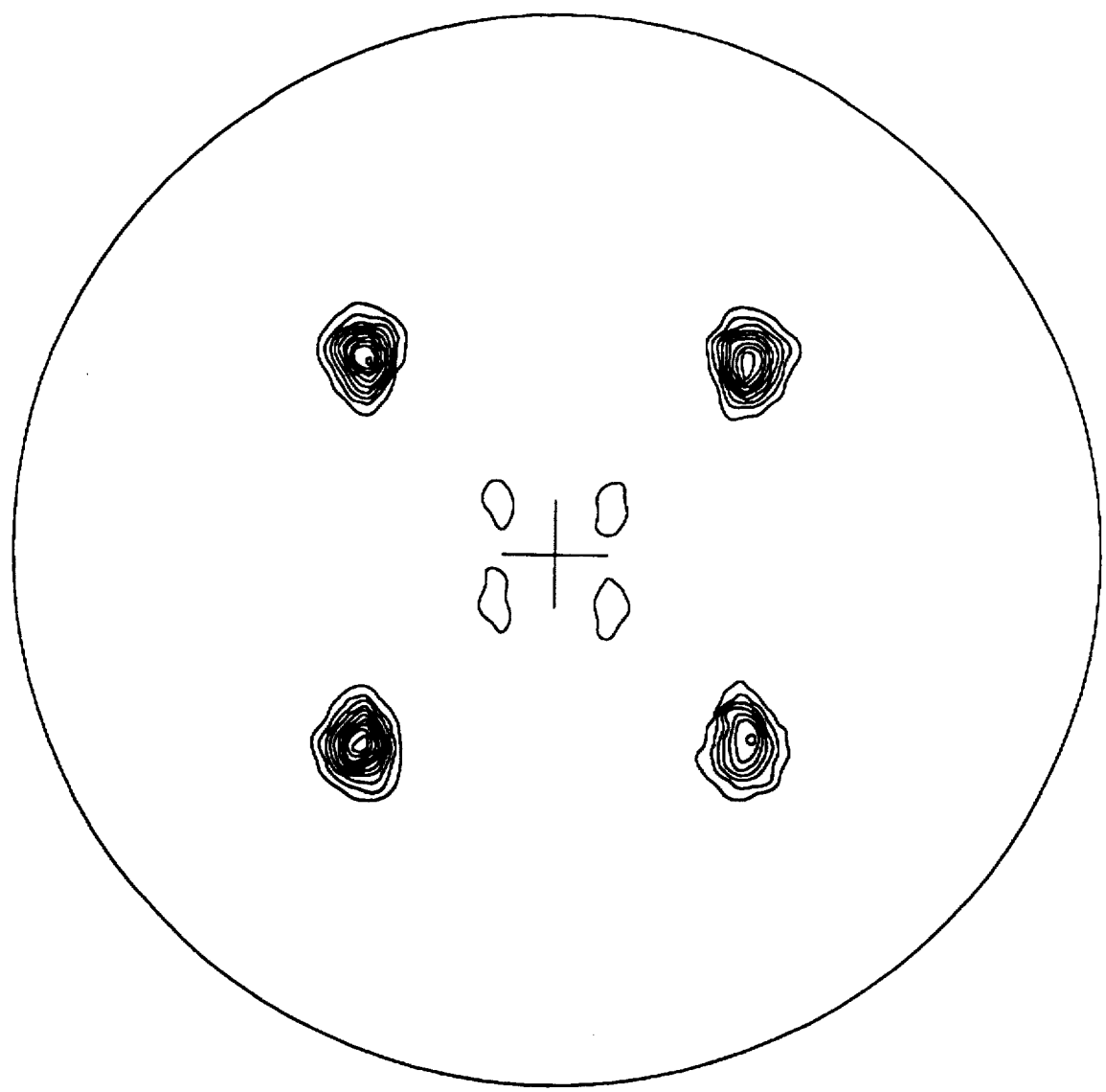
FIG. 5 is a Cu(111) X-ray pole figure showing the texture of a rolled and annealed Cu sheet.

FIG. 5 shows a pole figure depicting the strong in-plane as well as out-of-plane texture in the rolled and annealed Cu sheet.

Formation of a Textured Alloy Article

In general, it is difficult to obtain a sharp cube texture in alloys. High-purity metals like Cu, Al, Ni, Fe, etc. can be rolled to produce very sharp cube textures as described above. Small amounts of impurity elements can severely suppress the cube texture. For example, 5% Zn, 1% Sn, 4% Al, 0.5% Be, 0.5% Cd, 0.0025% P, 0.3% Sb, 1.5% Mg, 4.2% Ni, 0.18% Cd and 0.047% As in Cu, prevent the formation of the cube texture. Textured alloys can, however, be formed by rolling the pure metal and obtaining the desired texture, followed by diffusion of the desired alloying elements to form the required alloy.

Ag can be coated on the textured Cu sheet followed by heat treatment at high temperatures, thereby diffusing Ag into the Cu. The process can be continued until one is left with, in effect, a Ag-rich substrate with some Cu in it. Diffusion of Ag into Cu does not change the bulk cube texture of the sheet. Varying amounts of Ag can be diffused into the Cu.

Alternatively one can saturate the Cu with Ag. Subsequent deposition of Ag will now result in a top layer which is primarily Ag. In this way cube-textured Ag can be formed.

EXAMPLE V

A thick layer Ag(100μm) was electroplated using a standard electroplating technique on to a cube textured Cu substrate made according to the method described herein. The composite structure was then annealed at 800° C. in vacuum. The resulting material was a Ag—Cu alloy with all the electroplated Ag having diffused into the Cu. Both the lattice parameter as well the color of the copper strip was changed on annealing. However, the sharp cube texture of the original Cu strip was retained.

The instant method can be extended to many alloys, for example, alloys commonly known as nichrome (a Ni—Cr alloy), and inconel (a Cu—Ni alloy). Starting with biaxially textured Ni, one can diffuse Cr and form biaxially textured nichrome. Oxidation resistant layers on the surface of the biaxially textured Ni are formed by diffusing appropriate amounts of Cr, Mo, Al and Fe.

EXAMPLE VI

A layer of Cr was electroplated on a cube textured Ni substrate made according to the method described herein by a standard commercial electroplating technique. Subsequent annealing at 400° C. in vacuum resulted in diffusion of the Cr into the Ni strip. This resulted in a material having a Cr-rich exterior, while maintaining the desired cube texture.

Tuning of the lattice parameters of oriented substrates produced by rolling can also be done. For example, depositing a thin layer of Pd or Pt, etc., and subsequent diffusion of this layer into the textured Ni will result in the local alteration of the lattice parameter, which may be important for achieving better epitaxy of the barrier layer or the device layer.

The instant method can be extended to At- and Fe-based alloys to obtain chemically compatible, cube textured substrates.

EXAMPLE VII

Al is rolled according to the method described herein, using small final reductions prior to annealing to obtain a sharp cube texture. Ni is deposited on the surface by a conventional electroplating method. The composite structure is then heated at temperatures greater than 100° C. in vacuum. The resulting structure is a textured Ni—Al alloy.

Formation of a Brass Textured Metal Substrate by Rolling

Formation of brass texture in the substrate in Cu—, Ni—, Fe—, Al— and Ag— based alloys can be achieved by cold rolling by heavy reductions (at least 70%, preferably at least 80%) at room temperature followed by recrystallization annealing. In some cases, deformation temperatures as low as −230° C. may be required to produce a sharp texture. Annealing temperature should generally be at least 100° C.

Some of the alloys have excellent oxidation resistance, and if this is the case, highly textured substrates can be directly used as templates for a superconductor phase. In other cases, a chemically and structurally compatible barrier layer which can be grown epitaxially on the textured substrate (for example, a native oxide) can be used.

EXAMPLE VIII

Brass texture in 70% Cu—30% Zn is attained by rolling at room temperature using the following conditions:

Rolling speed: 15 ft./min.

Reduction per pass: 10%; total reduction=90%

Annealing temperature: 400° C.

Formation of the Goss Texture (110)[001]

This texture in silicon-iron steels can be produced by cycles of cold rolling and annealing. Processing variables are critical for getting maximum number of grains on cube-on-edge orientation (110)[001], and the minimum number of undesirable orientations, such as the major component of the ordinary primary recrystallization texture, the cube-on-point orientation (111)<211>. A desirable primary recrystallization texture is that consisting of small grains. This is obtained by having a suitable distribution of second phase materials such as manganese, sulfur, silica or vanadium nitride as grain growth inhibitors. The desired texture in this case is produced by secondary recrystallization, with the (110)[001] grains growing to a size 10 to 100 times the sheet thickness during annealing in suitable atmospheres and temperatures.

Formation of a Biaxially Textured Layer

Various layers comprised of different metals such as Cu, Ni, Al, Fe, etc., and ceramics can be deposited on the textured metal substrate. The texture of the substrate can be induced into the layer during deposition or during subsequent annealing.

EXAMPLE IX

A fully cube textured Cu sample was made according to the method described above. The sample was placed in a laboratory-scale evaporator in a vacuum of about $10^{-6}$ torr. Ag was deposited on the sample at room temperature by evaporation, followed by annealing at 200° C. in vacuum to produce a cube textured Ag layer. Results are shown in FIGS. 6 and 7.

Figure 6:
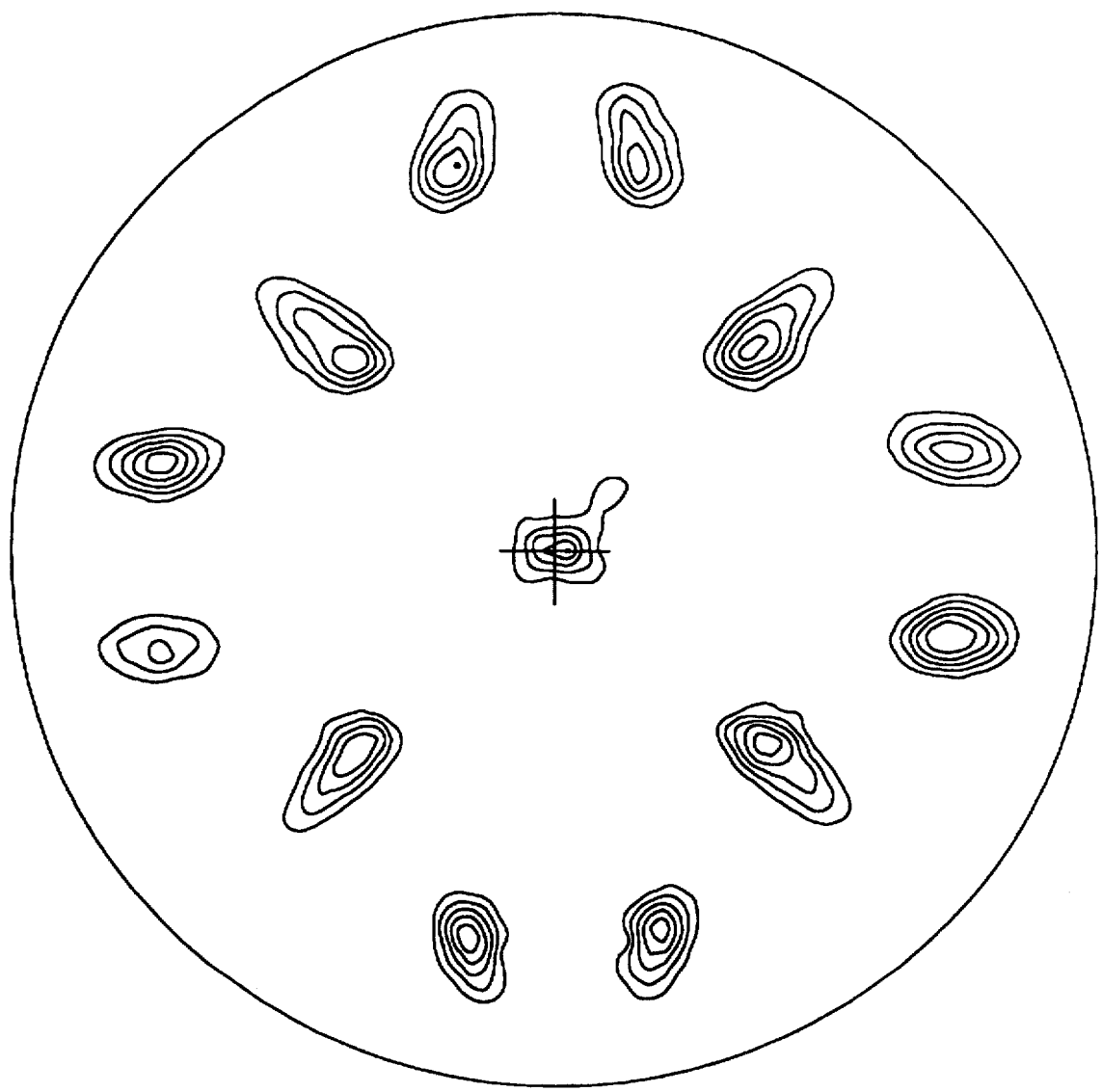
FIG. 6 is a Ag(111) X-ray pole figure showing the texture of a rolled and annealed Cu sheet with an as-deposited layer of Ag.
Figure 7:
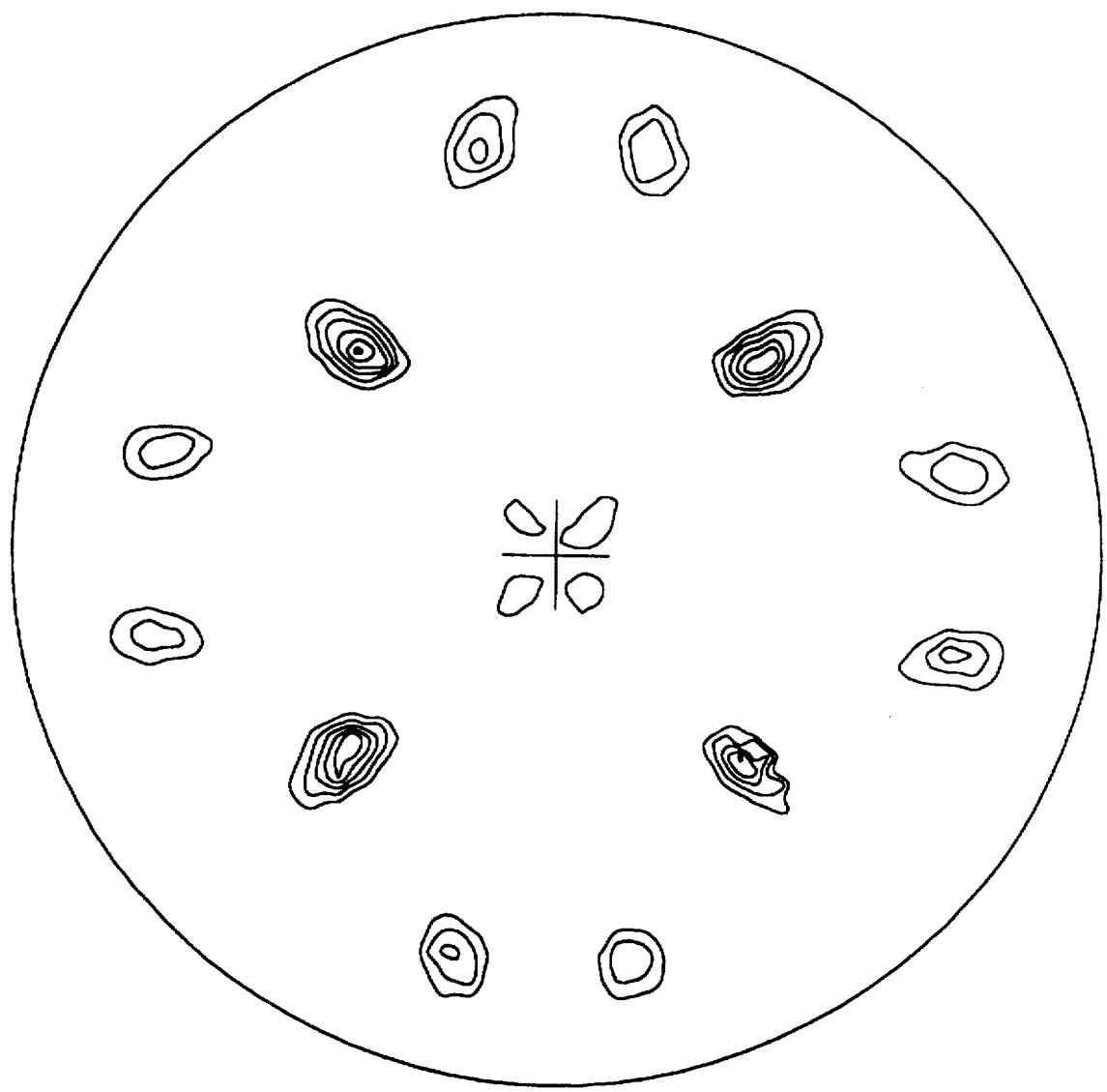
FIG. 7 is a Ag(111) X-ray pole figure showing the texture of a rolled and annealed Cu sheet with a layer of Ag after annealing.

FIG. 6 shows a pole figure of an as-deposited Ag layer on the Cu sheet. It is found to have a very sharp (111) texture. FIG. 7 shows the pole figure of the same sheet after annealing. It is found that the strong cube texture in the Cu is imparted on the Ag layer. This textured Ag can be used as a barrier layer, and a superconductor phase or other device layer can be grown on it. If the oxide layer on the Cu is removed prior to deposition of Ag, as-deposited Ag is cube textured.

In the case of textured Ni, a thin layer of another face-centered cubic material such as Pd, Pt, Cr, and/or Cu may be necessary before Ag is deposited.

EXAMPLE X

A biaxial textured laminate article was formed according to the invention by deposition of a Pd layer upon a textured Ni substrate, followed by deposition of an Ag layer upon the Pd layer. The deposition process used dual-source dc magnetron sputtering, and the deposition conditions were as follows:

Metal sputtering targets: Pd and Ag

Sputtering gas: Ar

Sputtering gas pressure: $6-10 \times 10^{-3}$ mbar

Substrate temperatures: 500° C. for Pd deposition, 300° C. for Ag deposition

Deposition rates: 30 nm/min for Pd deposition, 300 nm/min for Ag deposition

Layer thicknesses: 200 nm for Pd, 35 µm for Ag.

Figure 8:
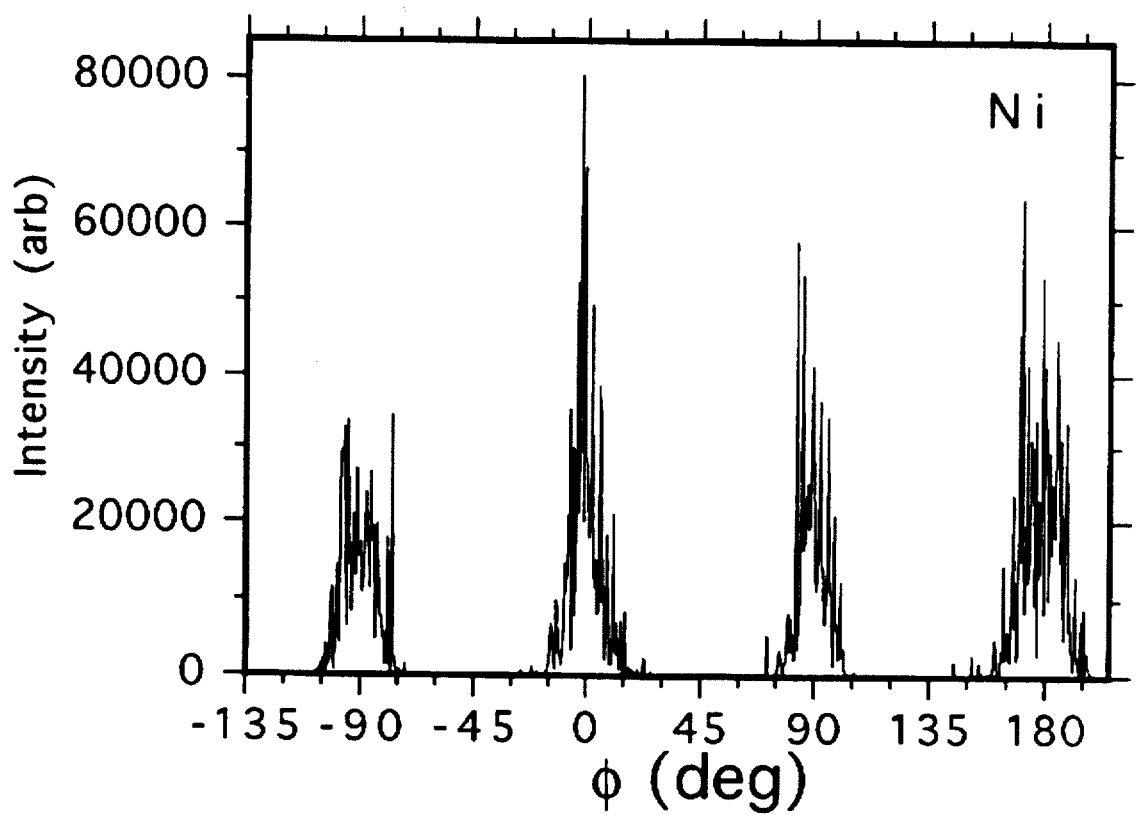
FIG. 8 is a graph showing an X-ray Φ scan through Ni(202) indicating in-plane alignment of the Ni substrate in a sample of Ag/Pd/rolled Ni.
Figure 9:
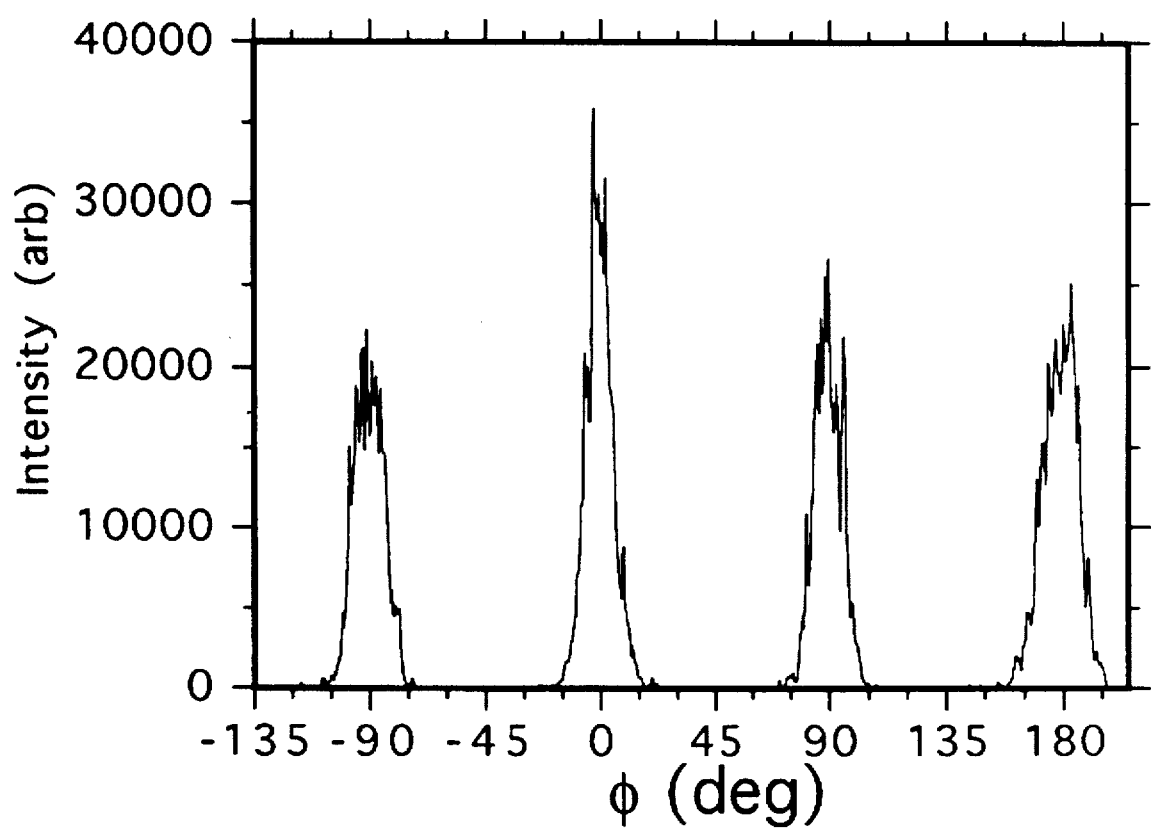
FIG. 9 is a graph showing an X-ray Φ scan through Pd(202) indicating in-plane alignment of the Pd layer in a sample of Ag/Pd/Rolled Ni.
Figure 10:
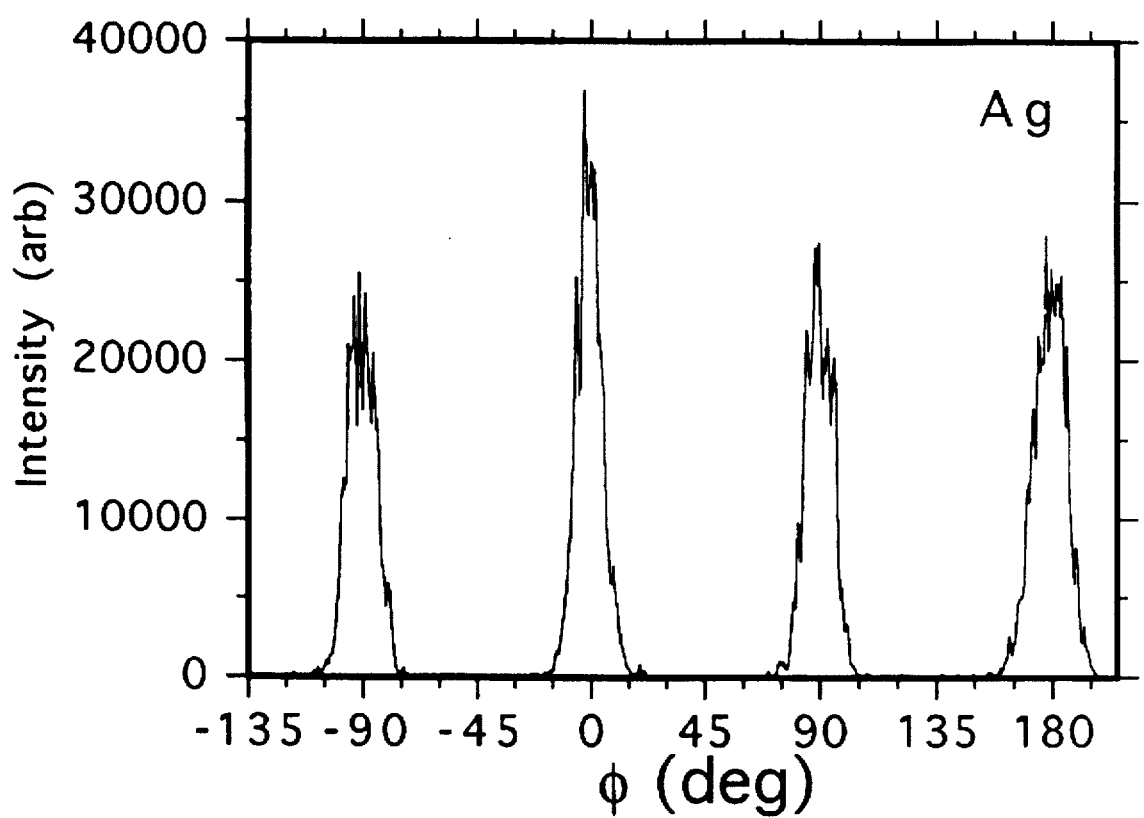
FIG. 10 is a graph showing an X-ray Φ scan through Ag(202) indicating in-plane alignment of the Ag layer in a sample of Ag/Pd/Rolled Ni.

Results are shown in FIGS. 8–10.

FIGS. 8–10 show (202) phi scans of a rolled, cube-textured Ni strip, with a thin layer of Pd, and then a layer of Ag on the Pd. The texture of the substrate can clearly be seen to be imparted on the layer.

A biaxially-textured alloy coating can also be formed by depositing at least two films of dissimilar metals on the surface of the biaxially-textured substrate, and subsequently annealing the coated substrate to a temperature sufficiently high to allow interdiffusion of the layers. If the layers are not epitaxial as-deposited, then epitaxial growth will occur during the annealing process.

EXAMPLE XI

On a biaxially-textured Ni substrate, a layer of 300 nm thick Pd was sputter-deposited at 500° C. A layer of 1000 nm thick Ag is then sputter-deposited at 300° C. This Ag/Pd/Ni epitaxial laminate structure was then annealed at 700° C. in vacuum. The resulting article consisted of a biaxially-textured Ag—Pd alloy coating on the biaxially-textured Ni.

Formation of a Biaxially Textured Laminate Article

A laminate article with a biaxially-textured ceramic layer is formed according to the invention by growing an epitaxial layer, such as yttria-stabilized zirconia (YSZ), MgO, TiN, $ZrO_2$, $CeO_2$, $SrTiO_3$, or $LaAlO_3$, on the previous described biaxially-textured metal substrates. Epitaxial ceramic layers can be grown using one of a variety of techniques including pulsed-laser deposition, sputtering, vapor deposition, chemical vapor deposition, sol-gel, spray pyrolysis, spin coating, and electrodeposition. A ferroelectric, electro-optic, superconducting, or other electromagnetic layer can then be epitaxially grown onto this biaxially-textured ceramic layer using one of the film growth techniques listed above. The final laminate article consists of a biaxially-textured ferroelectric, electro-optic, or superconducting film on a ceramic layer on a metal substrate. The rolling processes for fabricating the textured metal substrate described earlier enables the fabrication of long-length ferroelectric, electro-optic, superconducting, or other electromagnetic biaxially-textured laminate articles. When the final deposited layer is a superconductor, the resulting article is a superconducting tape with few or no weak-link high-angle grain boundaries. The ability to fabricate this article is a significant step in the development of superconducting high-current conductors for use at temperatures greater than 77K in high magnetic fields.

EXAMPLE XII

A biaxially textured laminate made according to Example X was introduced into a pulsed-laser deposition chamber. After sputter cleaning the Ag surface with an Ar ion gun, the laminate article was heated to 750° C. A 500 nm thick $CeO_2$ layer was then deposited by pulsed-laser deposition with an oxygen background pressure of $4 \times 10^{-4}$ Torr. A 1000 nm thick YBCO film was then deposited at 750° C. in 200 mTorr oxygen. The resulting laminate, biaxially-textured YBCO/$CeO_2$/Ag/Pd/Ni multilayer structure, was cooled in 1 atm oxygen. Results are shown in FIG. 11.

Figure 11:
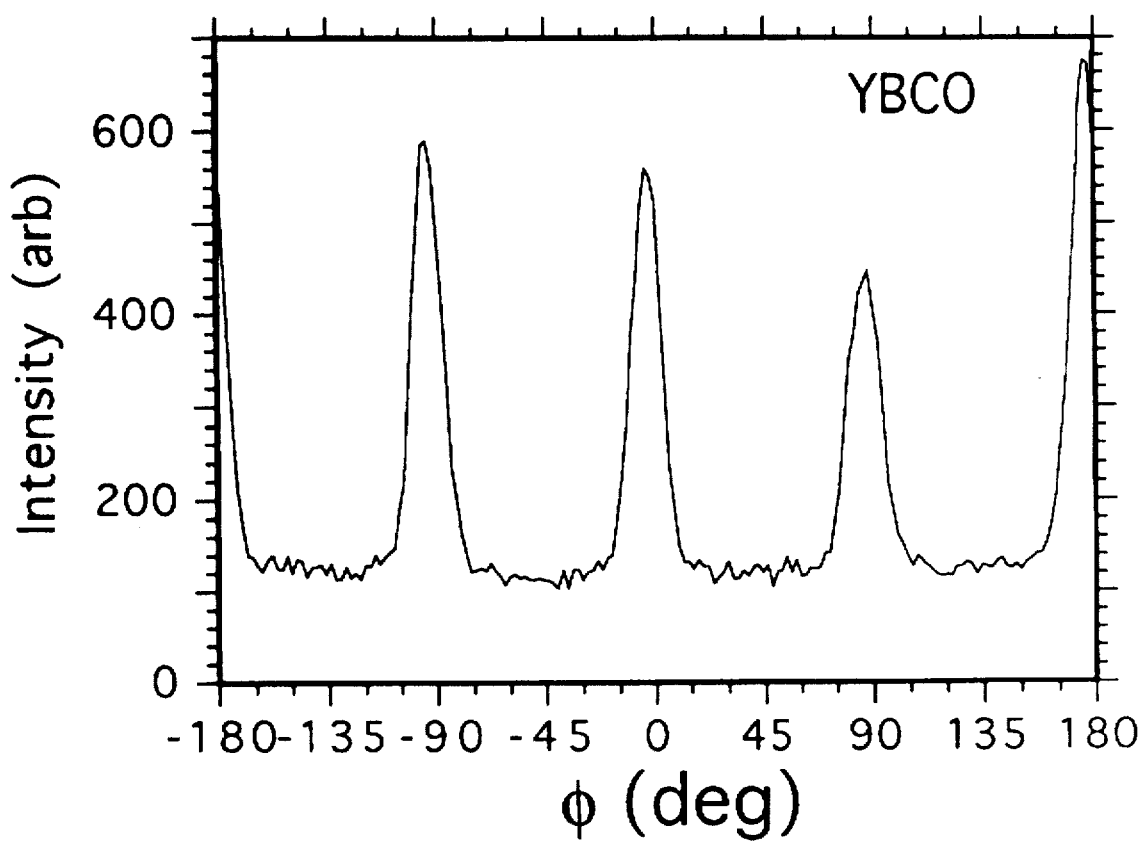
FIG. 11 is a graph showing an X-ray Φ scan through YBCO(226) reflection indicating inplane alignment of the YBCO superconductor in a sample of YBCO/CeO$_2$/Ag/Pd/Ni.

FIG. 11 shows the x-ray phi scan of the 226 reflection of the YBCO layer, indicating that the YBCO was c-axis oriented, biaxially-textured.

Formation of C-Axis Oriented, Biaxially-Textured Perovskite-Like Films on Biaxially-Textured Ag A two-step film growth process involving a non-superconducting ReBCO buffer template layer has been developed which enables the growth of c-axis oriented, biaxially-textured perovskite-like films on single crystal or biaxially-textured Ag. The substrate surface should be (110) or (100) biaxially-textured Ag. The substrate is heated to 600° C.–700° C., preferably 625° C. –675° C. Pulsed-laser deposition is then utilized to grow a ReBCO layer in an oxygen pressure of 50–300 mTorr, preferably 150–250 mTorr, onto the Ag surface. While this film does not have good superconducting properties, it is continuous with the c-axis perpendicular to the substrate surface, and aligned in-plane with respect to the crystal axes of the Ag. This ReBCO layer serves as a template for the growth of subsequent epitaxial perovskite-like layers. Note that the function of this ReBCO buffer template is to induce crystallographic alignment in subsequent layers rather than act as a superconductor. C-axis oriented, biaxially-textured films of selected perovskite-like materials, such as YBCO or $SrTiO_3$, can then be grown on this buffer template layer at a growth temperature which optimizes the desired properties of the perovskite-like film. ReBCO films which are c-axis oriented, biaxially-textured, and superconducting with a superconducting transition temperature of 80K–90K (−193° C. to −183° C.) are obtained on Ag using the above procedure by growing an additional ReBCO layer on the nonsuperconducting ReBCO template buffer layer at 730° C.–800° C. in 50–300 mTorr oxygen using pulsed-laser deposition. In contrast, growth of ReBCO directly on Ag at 730° C.–800° C. results in a film with a superconducting transition temperature less than 80K. The growth temperature necessary for obtaining the c-axis oriented ReBCO buffer template layer on Ag is not obvious as similar growth conditions produce a-axis oriented ReBCO on SrTiO$_3$ and similar substrates. The use of the nonsuperconducting ReBCO template buffer layer to achieve subsequent c-axis oriented, biaxially-textured perovskite-like layers on a Ag surface is a key element of this embodiment of the invention.

Use of the ReBCO buffer template enables the growth of c-axis oriented, biaxially textured (epitaxial) SrTiO$_3$ films on biaxially-textured Ag or other metals with a biaxially-textured Ag film. Direct growth of SrTiO$_3$ on Ag without the use of the buffer template results in (110) and (111) oriented films. SrTiO$_3$ is an excellent buffer layer for high-temperature superconducting materials.

The ReBCO buffer template layer provides a means to form c-axis oriented, biaxially-textured metal/perovskite-like heterostructures on biaxially-textured Ag. The perovskite-like film is grown on the ReBCO template using one of several film growth techniques such as sputtering, evaporation, spray pyrolysis, spin-coating, or chemical vapor deposition. Other possible uses of this invention include the growth of single crystal, biaxially textured (epitaxial) perovskite-like electro-optic or ferroelectric materials on biaxially-textured Ag important in the development of epitaxial metal/perovskite-like/metal multilayer devices.

EXAMPLE XIII

A single crystal (100) oriented Ag foil, produced by depositing Ag on (100) NaCl and dissolving the NaCl in water, was heated to 650° C. in a vacuum chamber. A 300 nm thick, c-axis oriented, biaxially-textured YBCO template layer was then deposited at 650° C. in 200 mTorr oxygen. The substrate was then heated to 780° C. A second 1000 nm thick YBCO layer was then deposited onto the YBCO template buffer layer at 780° C. in 200 mTorr. The laminate article was then cooled in 1 atm oxygen. The resulting YBCO film was predominantly c-axis oriented, biaxially-textured with a superconducting transition temperature of approximately 85K (−188° C.).

Formation of Biaxially Textured Superconductor Deposit

In some cases, barrier layers of ceramics such as YSZ, MgO, TiN, ZrO$_2$, CeO$_2$, and SrTiO$_3$, are deposited by techniques such as vapor deposition, sol-gel, electrodeposition, etc., followed by annealing to form epitaxial, biaxially textured layers on the textured substrate (metal/alloy). The superconductor is then deposited on the textured template.

The superconductor may be deposited by a variety of techniques (vapor deposition, laser ablation, sputtering, sol-gel, dip coating, electrodeposition, electrophoretic deposition, spray pyrolysis, doctor blade techniques, etc.). In some of the techniques (i.e., laser deposition, etc.) the as-deposited superconductor layer may be textured, but in other cases an additional oxygen anneal at appropriate oxygen partial pressures will be required to induce the texture from the substrate into the superconductor. The method also applies to precursor deposits to which one or more cations must be added from the vapor during reaction to form the superconducting phase. A complete demonstration of the textured substrate/textured layers is shown in FIG. 11, which shows phi scans of the 226 reflection of YBCO on CeO$_2$ on Ag on Pd on Ni.

While there has been shown and described what are at present considered the preferred embodiments of the invention, it will be obvious to those skilled in the art that various changes and modifications can be made therein without departing from the scope of the inventions defined by the appended claims.

What is claimed is:

1. A method of preparing a biaxially textured alloy article comprising the steps of:
   a. rolling and annealing a base metal preform to form a biaxially textured substrate having a surface, said base metal preform having a face-centered cubic, body-centered cubic, or hexagonal close-packed crystalline structure, said biaxially textured substrate being characterized by an x-ray diffraction phi scan peak of no more than 20° FWHM;
   b. depositing onto said surface of said biaxially textured substrate an alloying agent to form a laminate; and,
   c. heating the laminate to a sufficient temperature and for a sufficient time to cause interdiffusion of said base metal and said alloying agent, while maintaining the biaxial texture of said biaxially textured substrate, while transferring the biaxial texture to said alloying agent and while preventing homogeneous melting, to form a biaxially textured alloy article.

2. A method in accordance with claim 1 wherein the metal of said preform comprises at least one of Cu, Ni, Al, or Fe.

3. A method in accordance with claim 1 wherein said alloying agent comprises Ag, Pd, Pt, or an alloy of any of the foregoing.

4. A method in accordance with claim 1 further comprising the additional step of:
   d. depositing onto said biaxially textured alloy article at least one of an electromagnetic device or an electro-optical device.

5. A method in accordance with claim 1 wherein said article has at least one layer having superconducting properties.

6. A method of preparing a biaxially textured laminate article comprising the steps of:
   a. rolling and annealing a base metal preform to form a biaxially textured substrate having a surface, said base metal preform having a face-centered cubic, body-centered cubic, or hexagonal close-packed crystalline structure, said biaxially textured substrate being characterized by an x-ray diffraction phi scan peak of no more than 20° FWHM; and,
   b. depositing onto said surface of said biaxially textured substrate an epitaxial layer of material which is conducive to epitaxial deposition to form a biaxially textured laminate.

7. A method in accordance with claim 6 wherein the metal of said preform comprises at least one of Cu, Ni, Al, or Fe.

8. A method in accordance with claim 6 wherein said material comprises Ag, Pd, Pt, or an alloy of any of the foregoing.

9. A method in accordance with claim 6 further comprising the additional step of:
   c. depositing onto said biaxially textured laminate article at least one of an electromagnetic device or an electro-optical device.

10. A method in accordance with claim 6 wherein said article has at least one layer having superconducting properties.

11. A method of preparing a biaxially textured laminate article comprising the steps of:
    a. rolling and annealing a base metal preform to form a biaxially textured substrate having a surface, said base metal preform having a face-centered cubic, body-centered cubic, or hexagonal close-packed crystalline structure, said biaxially textured substrate being characterized by an x-ray diffraction phi scan peak of no more than 20° FWHM;

b. depositing onto said surface of said biaxially textured substrate a layer of material which is conducive to induced epitaxy to form a laminate; and, c. heating the laminate to a sufficient temperature and for a sufficient time to induce epitaxy in said material to form a biaxially textured laminate.

12. A method in accordance with claim 11 wherein the metal of said preform comprises at least one of Cu, Ni, Al, or Fe.

13. A method in accordance with claim 11 wherein said material comprises Ag, Pd, Pt, or an alloy of any of the foregoing.

14. A method in accordance with claim 11 further comprising the additional step of:

d. depositing onto said biaxially textured laminate article at least one of an electromagnetic device or an electro-optical device.

15. A method in accordance with claim 11 wherein said article has at least one layer having superconducting properties.

16. A method in accordance with claim 11 wherein step b comprises depositing onto said surface of said biaxially textured substrate at least two layers of different materials which are conducive to formation of a biaxially textured alloy, and wherein said materials form a biaxially textured alloy upon carrying out said heating step.

* * * * *